United States Patent
Sato et al.

(10) Patent No.: US 7,432,580 B2
(45) Date of Patent: *Oct. 7, 2008

(54) SEMICONDUCTOR DEVICE WITH A SUBSTRATE HAVING A SPIRAL SHAPED COIL

(75) Inventors: Akihiro Sato, Gunma-ken (JP); Satoru Sekiguchi, Saitama (JP); Kiyokazu Kamado, Gunma-ken (JP); Kazunari Kurokawa, Gunma-ken (JP); Makoto Tsubonoya, Gunma-ken (JP); Kiyoshi Mita, Gunma-ken (JP); Yoichi Nabeta, Gunma-ken (JP); Tetsuro Sawai, Gifu (JP); Toshikazu Imaoka, Gifu (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 52 days.

This patent is subject to a terminal disclaimer.

(21) Appl. No.: 11/314,039

(22) Filed: Dec. 20, 2005

(65) Prior Publication Data

US 2006/0131724 A1   Jun. 22, 2006

(30) Foreign Application Priority Data

Dec. 21, 2004 (JP) ............................. 2004-370031
Nov. 14, 2005 (JP) ............................. 2005-329184

(51) Int. Cl.
*H01L 23/58* (2006.01)
*H05K 7/00* (2006.01)

(52) U.S. Cl. ....................... 257/516; 257/692; 257/783; 361/782; 361/811

(58) Field of Classification Search ...................... None
See application file for complete search history.

(56) References Cited

U.S. PATENT DOCUMENTS

| 3,997,835 | A  |   | 12/1976 | Ando et al. | |
|-----------|----|---|---------|-------------|---|
| 5,752,182 | A  | * | 5/1998  | Nakatsuka et al. | 455/333 |
| 6,362,525 | B1 | * | 3/2002  | Rahim | 257/738 |
| 6,388,636 | B1 | * | 5/2002  | Brown et al. | 343/866 |
| 6,495,915 | B1 | * | 12/2002 | Hsieh et al. | 257/728 |
| 6,538,305 | B2 | * | 3/2003  | Ichinose | 257/666 |

(Continued)

FOREIGN PATENT DOCUMENTS

JP    08-16745    1/1996

(Continued)

OTHER PUBLICATIONS

European Patent Office Search Report, Application No. EP 05257863 05257863.0-2203 by Sanyo Electronic Co., Ltd. et al., Search Report dated Jun. 06, 2008.

*Primary Examiner*—Alonzo Chambliss
(74) *Attorney, Agent, or Firm*—SoCal IP Law Group LLP; Steven C. Sereboff; John E. Gunther

(57) ABSTRACT

A semiconductor apparatus comprises a substrate, a semiconductor chip fixedly secured on one side of the substrate, a spirally shaped coil formed on the other side of the substrate and electrically connected to the semiconductor chip, and a conductive pattern formed on a surface of the one side of the substrate facing to the semiconductor chip for stabilizing an inductance characteristic of the coil.

19 Claims, 8 Drawing Sheets

U.S. PATENT DOCUMENTS 6,800,936 B2 * 10/2004 Kosemura et al. .......... 257/748
2004/0207064 A1 10/2004 Brooks et al.

FOREIGN PATENT DOCUMENTS

| JP | 2002-093847 | 3/2002 |
| JP | 2003-008276 | 1/2003 |
| JP | 2004-014534 | 1/2004 |

* cited by examiner

SEMICONDUCTOR DEVICE WITH A SUBSTRATE HAVING A SPIRAL SHAPED COIL

CROSS-REFERENCE TO RELATED APPLICATIONS

The present application claims priority from Japanese Patent Applications No. 2004-370031 filed on Dec. 21, 2004 and No. 2005-329184 filed on Nov. 14, 2005 which are herein incorporated by reference.

BACKGROUND OF THE INVENTION

1. Field of the Invention

The present invention relates to a semiconductor apparatus and a circuit apparatus having the semiconductor apparatus mounted thereon.

2. Description of the Related Art

Recently, small-size electronic devices are widely spread, which are a cellular phone, a portable audio device, a PDA, a digital camera, etc. These electronic devices are demanded to be smaller, to have more functions, to have higher performance, etc. As a result, if an electronic device is manufactured, packaging technology, etc. are required for enabling higher density. See, e.g., Japanese Patent Application Laid-Open Publication No. 2002-93847.

In order to complying with such a requirement, recently, for example, an AM/FM tuner is constituted by one (1) package (semiconductor apparatus) and is provided as a commercial product which can be mounted on a portable electronic device. Although a package exists conventionally which stores almost all parts of a tuner as one (1) IC chip (semiconductor chip), for example, an inductor (coil), a varactor diode, etc. of a local oscillator circuit still must be mounted on a printed wiring substrate of an electronic device as an external part along with the package. In the package described here, an IC chip is electrically connected to a conductive path formed on the one side of a resin substrate and is then sealed with mold resin (insulating resin). On the contrary, recently, in order to store external parts into one (1) package, a pattern for a coil is formed on the other side (i.e., the under side of the package) of the substrate of the package, or a capacitor bank is incorporated into an IC chip, instead of a varactor diode which has relatively large dimensions. The capacitor bank is constituted by connecting a plurality of condensers having capacities differentiated by a predetermined size in parallel and the frequency is changed by sequentially switching the capacities with the use of software. In this way, by using the recent so-called "one-chip" package, a portable electronic device can also be equipped with a function of a radio easily.

By the way, in general, in order to maintain a good frequency characteristic of a LC circuit of the above-described local oscillator circuit, etc., the inductance characteristic of the coil must be stable. The inductance described here means the inductance of the coil stored along with the IC chip, etc. into the package mounted on a printed wiring substrate, for example. If the package is equipped on an electronic device, etc. by a user of the package, in order the inductance characteristic of the coil to maintain stability assumed on the manufacturer side, for example, predetermined mounting conditions are recommended from the manufacture side to the user side. The predetermined mounting conditions are, for example, to preliminarily form a dummy conductive pattern on a surface of the under side of the package, which is opposed to the coil, on the printed wiring substrate. In this way, the inductance of the coil is less affected by the printed wiring substrate.

However, for example, since the above-described dummy conductive pattern should be formed on a printed wiring substrate of the user side based on mounting conditions, etc. recommended from the user side, details of the shape, material, etc. thereof must be depending on the design of the user side. The accuracy of the package mounting position relative to the dummy conductive pattern must be depending on the operating accuracy of the user side. Therefore, the mutual inductance, etc. between the dummy conductive pattern and the coil are varied depending on the design and the operating accuracy of the user side. Consequently, the inductance characteristic and the stability assumed on the manufacturer side based on a single package may not be reproduced when mounting on an electronic device, etc. to be used on the user side. Alternatively, in order to reproduce the inductance characteristic and the stability, the user side may be forced to bear the burden in terms of the operation, etc. at the time of the package mounting.

In consideration of the above, it cannot be said exactly that the package requiring the above-described dummy conductive pattern is "one-chip" which does not need external parts at all, and the user side may end up being troubled.

In the single package, if an error is generated in the IC chip mounting position, etc. relative to the one side of the substrate described above, the operation of the IC chip may affect the inductance characteristic and the stability of the coil on the other side of the substrate. On the other hand, once sealed with insulating resin as described above, it is difficult to readjust the inductance of the coil in the package. Therefore, in order to maintain a predetermined inductance characteristic and stability of the coil, the operating accuracy must be improved when manufacturing the package and this is a burden on the maker side, which may result in a higher cost of the package.

SUMMARY OF THE INVENTION

The present invention was conceived in consideration of such problems. It is therefore an object of the present invention to provide a low-cost semiconductor apparatus which can easily reproduce a pre-mounted inductance characteristic and stability thereof after mounting and which is easily mounted.

In order to achieve the above and other objects, according to a first aspect of the present invention there is provided a semiconductor apparatus comprising a substrate, a semiconductor chip fixedly secured on one side of the substrate, and a spirally shaped coil formed on the other side of the substrate and electrically connected to the semiconductor chip, wherein a conductive pattern is formed on a surface of the one side of the substrate facing to the semiconductor chip for stabilizing an inductance characteristic of the coil.

To achieve the above and other objects, according to a second aspect of the present invention there is provided a semiconductor apparatus comprising a first substrate, a semiconductor chip fixedly secured on one side of the first substrate, a spirally shaped coil formed on the other side of the first substrate, a first through-hole extending between one side and the other side of the first substrate and electrically connecting an electrode of the semiconductor chip and an electrode of the coil, a conductive pattern formed on a surface of the one side of the first substrate facing to the semiconductor chip for stabilizing an inductance characteristic of the coil, a second through-hole extending between the one side and the other side of the first substrate and electrically connecting another electrode of the semiconductor chip and an electrode formed on the other side of the first substrate, and an insulating resin covering the one side of the first substrate.

To achieve the above and other objects, according to a third aspect of the present invention there is provided a circuit apparatus comprising a semiconductor apparatus having a first substrate, a semiconductor chip fixedly secured on one side of the first substrate, a spirally shaped coil formed on the other side of the first substrate and electrically connected to the semiconductor chip, and a conductive pattern formed on a surface of one side of the first substrate facing to the semiconductor chip for stabilizing an inductance characteristic of the coil, and a second substrate mounted with the semiconductor apparatus such that the other side of the first substrate faces to the second substrate.

To achieve the above and other objects, according to a fourth aspect of the present invention there is provided a semiconductor apparatus comprising a substrate, a semiconductor chip fixedly secured on one side of the substrate, a spirally shaped coil formed on a surface of the one side of the substrate facing to the semiconductor chip and electrically connected to the semiconductor chip, and a conductive pattern formed on a surface of the other side of the substrate opposite to the coil for stabilizing an inductance characteristic of the coil.

To achieve the above and other objects, according to a fifth aspect of the present invention there is provided a semiconductor apparatus comprising a first substrate, a semiconductor chip fixedly secured on one side of the first substrate, a spirally shaped coil formed on a surface of the one side of the first substrate facing to the semiconductor chip and electrically connected to the semiconductor chip, a conductive pattern formed on a surface of the other side of the first substrate opposite to the coil for stabilizing an inductance characteristic of the coil, an electrode formed on a surface of the other side of the first substrate, a through-hole extending between the one side and the other side of the first substrate and electrically connecting an electrode of the semiconductor chip and an electrode formed on a surface of the other side of the first substrate, and an insulating resin covering the one side of the first substrate.

To achieve the above and other objects, according to a sixth aspect of the present invention there is provided a circuit apparatus comprising a semiconductor apparatus having a first substrate, a semiconductor chip fixedly secured on one side of the first substrate, a spirally shaped coil formed on a surface of the one side of the first substrate, and a conductive pattern formed on a surface of the other side of the first substrate opposite to the coil for stabilizing an inductance characteristic of the coil, and a second substrate facing to the other side of the first substrate and mounted with the semiconductor apparatus.

A low-cost semiconductor apparatus can be thus provided which can easily reproduce a pre-mounted inductance characteristic and stability thereof after mounting and which is easily mounted.

BRIEF DESCRIPTION OF THE DRAWINGS

The above and other objects, aspects, features and advantages of the present invention will become more apparent from the following detailed description when taken in conjunction with the accompanying drawings, in which.

DETAILED DESCRIPTION OF THE INVENTION

<<Configuration of Semiconductor Apparatus>>

Figure 1A:
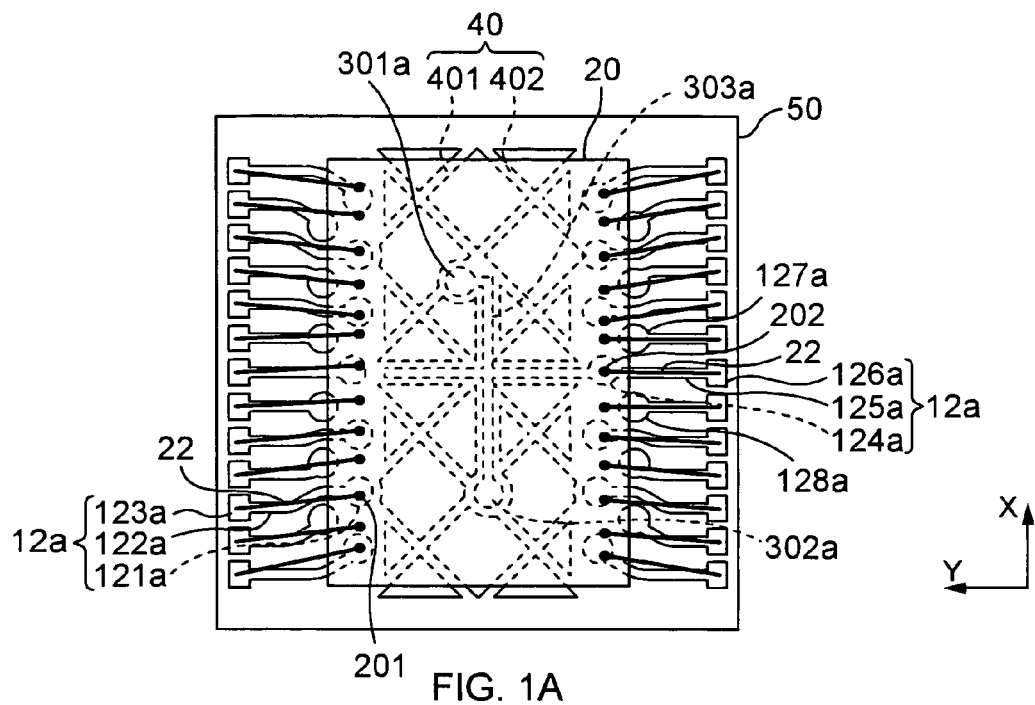
FIG. 1A is a plan view of the upper side of the semiconductor apparatus of the implementation.
Figure 1B:
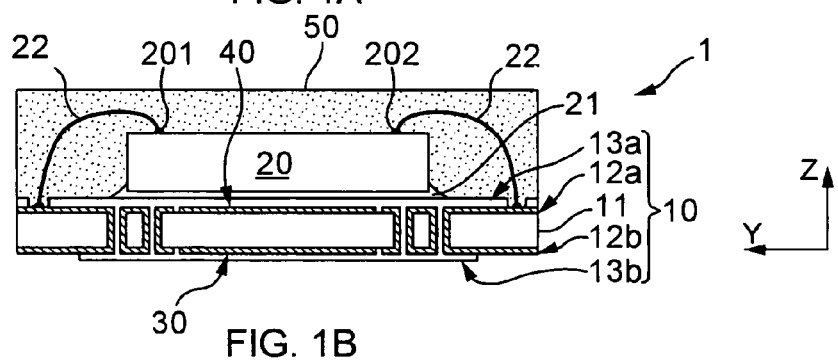
FIG. 1B is a side view of the semiconductor apparatus of the implementation.
Figure 1C:
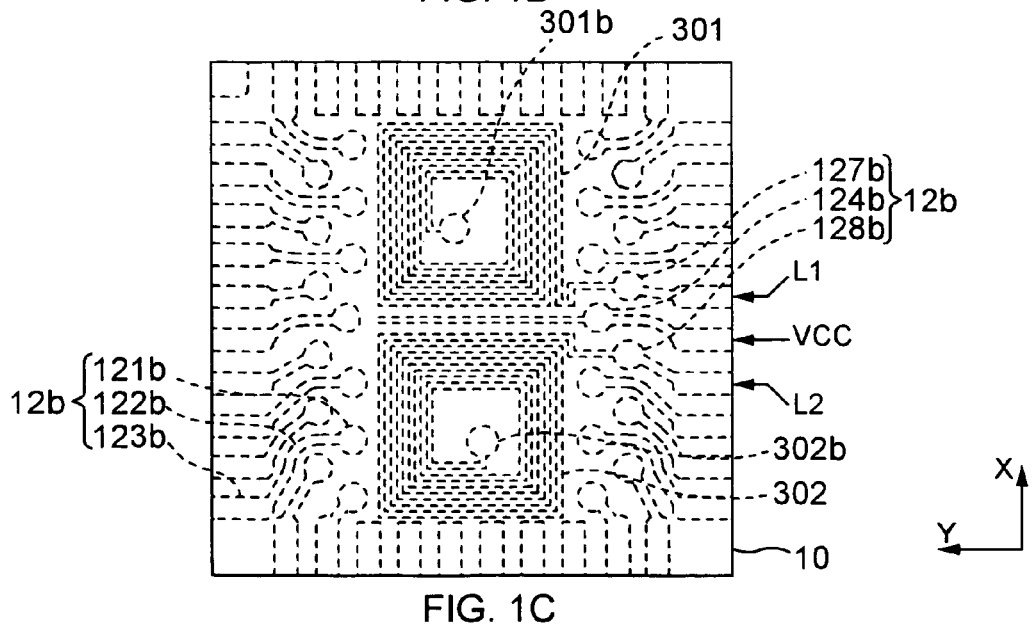
FIG. 1C is a perspective view of the under side of the semiconductor apparatus of the implementation seen from the upper side.

A configuration example of the implementation of a semiconductor apparatus 1 is described with reference to FIGS. 1A to 1C. FIG. 1A is a plan view of the upper side of the semiconductor apparatus 1; FIG. 1B is a side view of the semiconductor apparatus 1; and FIG. 1C is a perspective view of the under side of the semiconductor apparatus 1 seen from the upper side. Hereinafter, in this semiconductor apparatus 1, the side of an IC chip described later is referred to as the "upper side" and, in this semiconductor apparatus 1, the side of a coil described later is referred to as the "under side". As illustrated in FIG. 1A and FIG. 1C, the semiconductor apparatus 1 of the implementation is a package with the upper and under sides which are an approximate square shape, for example. A length of a side of the approximate square is 5 mm, for example. A thickness (length in the Z direction) of the package illustrated in FIG. 1B is on the order of 1 mm, for example. Therefore, the semiconductor apparatus 1 of the implementation forms a shape of a flat plate having the approximate square upper and under sides. However, the semiconductor apparatus 1 is not limited to the approximate square flat plate shape having the dimensions described above.

As illustrated in FIGS. 1A to 1C, the semiconductor apparatus 1 is constituted by mainly comprising a substrate (first substrate) 10, an IC chip (semiconductor chip) 20, a coil 30 and a dummy pattern (conductive pattern) 40 described later.

With regard to the substrate 10, the main material is an insulating substrate 11 (FIG. 1B) made of, for example, glass epoxy, and a predetermined conductive path 12a (FIG. 1B) is affixed to the upper side thereof, which is coated thereon with an insulating solder resist pattern 13a (FIG. 1B). To the under side of the insulating substrate 11, a predetermined conductive path 12b (FIG. 1B) is affixed, which is coated thereon with an insulating solder resist pattern 13b (FIG. 1B). Through-holes (first through-holes and second through holes) (FIGS. 3A to 3C) are bored in the insulating substrate 11, penetrating between the upper side and under side.

As illustrated in FIG. 1A, the predetermined conductive path 12a affixed to the upper side is constituted by comprising 26 IC chip patterns and one (1) coil pattern, for example. Each IC chip pattern is constituted by a through-hole opening electrode (e.g., an opening electrode 121a), wiring (e.g., wiring 122a), and an internal electrode (e.g., an internal electrode 123a). The coil pattern is constituted by through-hole opening electrodes 301a, 302a for the coil and wring 303a in a cross shape.

As illustrated in FIG. 1C, the predetermined conductive path 12b affixed to the under side is constituted by comprising patterns corresponding to the above-described 26 IC chip patterns and opening electrodes 301b, 302b corresponding to the through-hole opening electrodes 301a, 302a for the coil described above. Each pattern is constituted by an opening electrode (e.g., an opening electrode 121b), wiring (e.g., wiring 122b) and an external terminal (e.g., an external terminal 123b).

The opening electrode 121a on the upper side and the opening electrode 121b on the under side of the through-hole are oppositely arranged on each side.

The IC chip 20 (FIGS. 1A and 1B) is, for example, a bear chip internally forming portions other than the coil of the semiconductor apparatus 1 of the implementation. As illustrated in FIG. 1A, the IC chip 20 is comprised of 13 electrodes 201, 202 on each of the left and right sides of the Y axis, for example. These 26 electrodes 201, 202 are electrically connected to 26 internal electrodes 123a respectively with metal thin lines 22. Although the IC chip 20 of the implementation has, for example, an approximate rectangular flat plate shape which is one size smaller than the approximate square of the above-described substrate 10, the present invention does not limited to this. For the IC chip 20 of the implementation, the number of the electrodes 201, 202 as well as the number of the internal electrodes, external terminals, etc. determined correspondingly are not limited to 26 as described above.

As illustrated in FIG. 1C, the coil 30 is composed of two flat coils 301, 302 in a spiral shape affixed to the insulating substrate 10, as a portion of the under-side conductive path 12b described above.

The coil 301 and the coil 302 are connected to the wring 303a in a cross shape such that the opening electrodes 301b, 302b (FIG. 1C) and the opening electrodes 301a, 302a (FIG. 1A) described above have the same electric potential. The wiring 303a in a cross shape is electrically connected to the electrode 202 of the IC chip 20 via the wiring 125a, the internal electrode 126a and the metal thin line 22. On the other hand, this wiring 303a in a cross shape is connected to an external terminal VCC (FIG. 1C) via the opening electrode 124a (FIG. 1A) and the opening electrode 124b (FIG. 1C) to have the same electric potential. The opening electrodes 301b, 302b can be considered as the electrodes of two coils 301, 302 on one side.

Electrodes on the other side of two coils 301, 302 can be considered as opening electrodes 127b, 128b illustrated in FIG. 1C. An external terminal L1 is electrically connected to the electrode of the IC chip 20 via the opening electrode 127b and the opening electrode 127a. Similarly, an external terminal L2 is electrically connected to the electrode of the IC chip 20 via the opening electrode 128b and the opening electrode 128a.

The entire surface of the under side of the substrate 10 is coated with the solder resist pattern 13b described above, except 26 external terminals described above.

Figure 2:
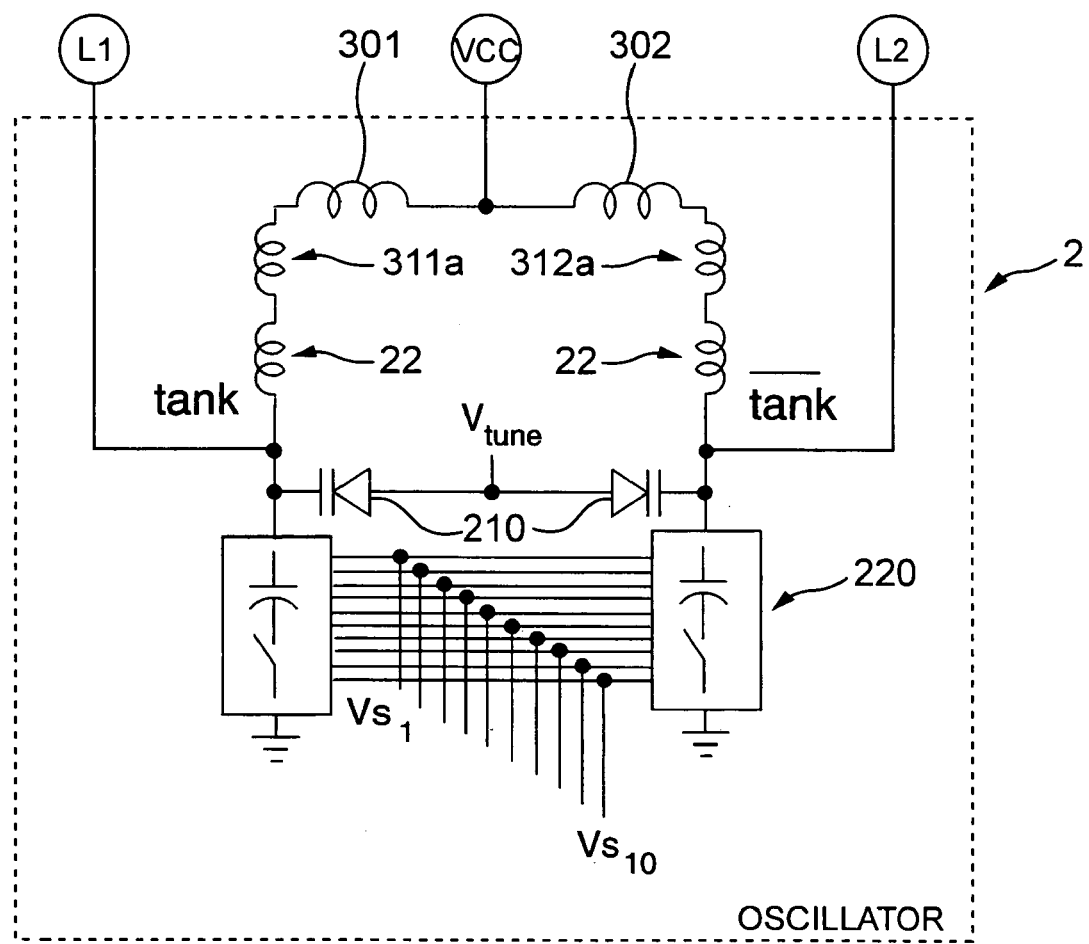
FIG. 2 is a circuit diagram showing an example of an equivalent circuit for an oscillator of the semiconductor apparatus of the implementation.

As illustrated in a circuit diagram of FIG. 2, the semiconductor apparatus 1 of the implementation may be, for example, a tuner apparatus such that a portion of the IC chip 20 and the coils 301, 302 are equivalent to an oscillator in a local oscillator circuit. In an equivalent circuit 2 illustrated in FIG. 2, the coils (inductors) 301, 302 illustrated in FIG. 1C are connected in series with each of inductors 311a, 312a originated from the package, such as the conductive paths 12a, 12b. To these inductors 311a, 312a, each of the metal thin lines 22, etc. is serially connected as inductors originated from wire bonding. However, in this implementation, the contribution of these inductors to the coils 301, 302 is on the order of 25%, for example.

As illustrated in FIG. 2, an internal diode 210 and a capacitor bank 220 are connected to each of the inductors 301, 311a, 22 and the inductors 302, 312a, 22. The internal diode 210 and the capacitor bank 220 are formed internally to the IC chip 20. The capacitor bank 220 of the implementation is constituted by connecting, for example, 10 condensers having capacities differentiated by a predetermined size in parallel and the frequency is changed by sequentially switching the capacities with the use of software.

The semiconductor apparatus 1 of the implementation is not limited to the tuner apparatus described above.

Figure 3A:
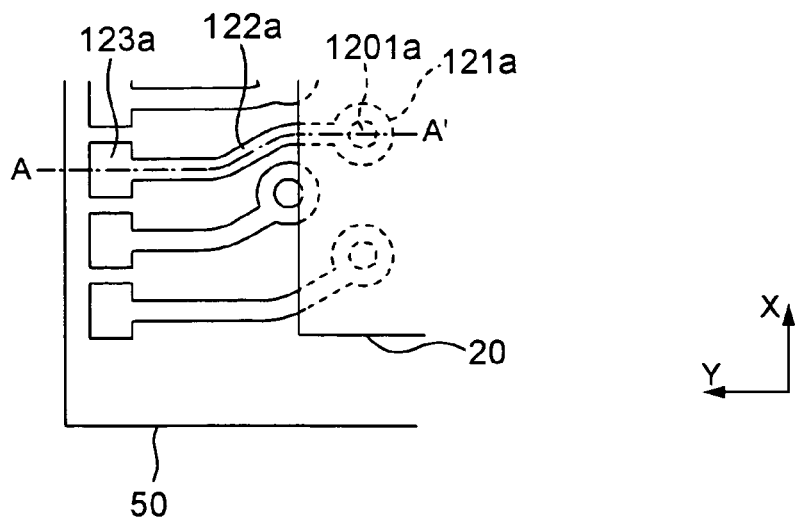
FIG. 3A is a plan view enlarging a portion of the semiconductor apparatus of the implementation.
Figure 3B:
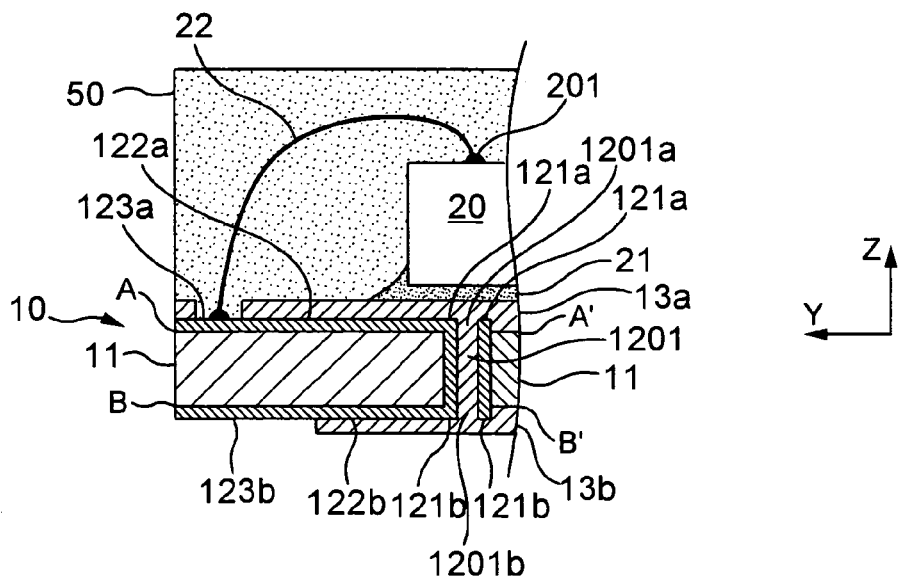
FIG. 3B is a plan view enlarging a portion of the semiconductor apparatus of the implementation.
Figure 3C:
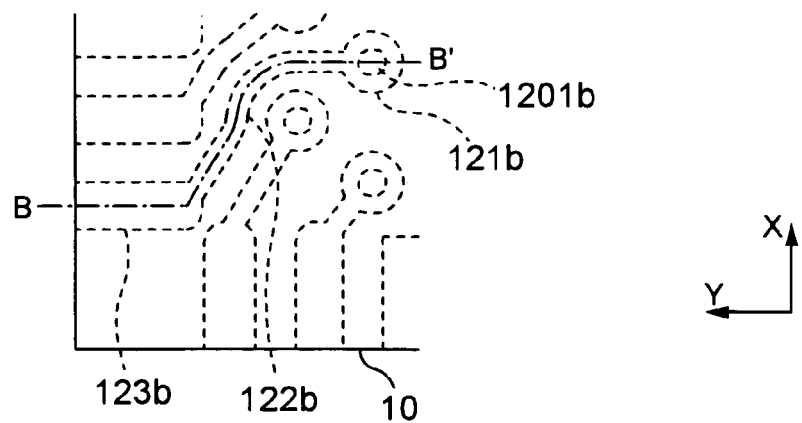
FIG. 3C is a perspective view enlarging a portion of the semiconductor apparatus of the implementation.

For an example of the electrical connection between the conductive paths 12a, 12b and the IC chip 20 in the semiconductor apparatus 1 of the implementation, more detail descriptions are made with reference to FIGS. 3A to 3C. FIG. 3A is an enlarged plan view of the lower left portion of the semiconductor apparatus 1 of FIG. 1A; FIG. 3B is an enlarged plan view of the left portion of the semiconductor apparatus 1 of FIG. 1B; and FIG. 3C is an enlarged perspective view of the lower left portion of the semiconductor apparatus 1 of FIG. 1C.

As illustrated in FIG. 3A, the above-described opening electrode 121a, wiring 122a and internal electrode 123a affixed to the upper side of the insulating substrate 11 are an integral conductor. When the conductor is cut along a curved line from A to A' of FIG. 3A and is looked from the X direction, the cross section corresponds to a portion of A-A' of FIG. 3B. As illustrated in FIG. 3B, the internal electrode 123a is exposed from a gap of the solder resist pattern 13a and, under the coating of the solder resist pattern 13a, the wiring 122a and the opening electrode 121a are connected to a through-hole 1201 coated therein with the similar conductor.

As illustrated in FIG. 3C, the above-described opening electrode 121b, wiring 122b and external terminal 123b affixed to the under side of the insulating substrate 11 are an integral conductor. When the conductor is cut along a curved line from B to B' of FIG. 3C and is looked from the X direction, the cross section corresponds to a portion of B-B' of FIG. 3C. As illustrated in FIG. 3B, the external terminal 123b is exposed from a gap of the solder resist pattern 13b and, under the coating of the solder resist pattern 13b, the wiring 122b and the opening electrode 121b are connected to the through-hole 1201 described above.

From the description above, the internal electrode 123a and the external terminal 123b are electrically connected via the through-hole 1201 having openings 1201a, 1201b on each opposing side of the substrate 10. On the other hand, as illustrated in FIG. 3B, the internal electrode 123a is electrically connected to the electrode 201 of the IC chip 20 via the metal thin line 22. Therefore, the external terminal 123b acts as a terminal of the IC chip 20 in the semiconductor apparatus 1.

A connection example between the conductive paths 12a, 12b via another through-hole is the same as the example illustrated in FIGS. 3A to 3C. In the implementation, through-holes relevant to the opening electrodes 124a, 127a, 128a, 301a, 302a illustrated in FIG. 1A correspond to the first through-holes electrically connecting the coil 30 and the IC chip 20, and all through-holes other than these through-holes correspond to the second through-holes. The inside of each through-hole of the implementation is sealed with the solder resist.

<<Configuration of Conductive Pattern>>

Returning to FIG. 1, a configuration example of the dummy pattern 40 of the implementation is described. The dummy pattern 40 may include an integral flat conductor, for example. However, a particular effect described later is achieved by the dummy pattern 40 constituted by arranging a plurality of conductors spaced by predetermined narrow gaps.

As illustrated in FIG. 1A, the dummy pattern 40 of the implementation is formed on the upper side of the insulating substrate 10 oppositely to the coils 301, 302 on the under side of the insulating substrate 10. Specifically, the dummy pattern 40 of the implementation is constituted by arranging isolated conductors 401 made mainly of, for example, copper (Cu) in an approximate square shape spaced by narrow gaps (predetermined gaps) 402 such that an angle of about 45 degrees is formed relative to the side of the approximate rectangular of the IC chip 20. The approximate square shape and 45 degrees are an example. A plurality of gaps 402 has linear shapes orthogonal to each other, for example. Since a contour of the dummy pattern 40 is aligned to a contour of an approximate rectangular combining two coils 301, 302, a portion of the conductors 401 in an approximate square shape has an approximate triangular shape near the contour. Since the conductors 401 of the dummy pattern 40 surround the above-described opening electrodes 301a, 302a and wiring 303a in a cross shape at a distance of the narrow gap, a portion of the conductors 401 in an approximate square shape has approximate triangular shape has, for example, an approximate triangular shape near the opening electrodes 301a, 302a and wiring 303a. These conductors 401 are affixed to the upper side of the insulating substrate 10 and are coated with the solder resist pattern 13a. To the solder resist pattern 13a, the IC chip 20 is fixed via an insulating paste (insulating adhesive) 21.

By the way, since the conductors 401 of the dummy pattern 40 forms a convex shape in the Z direction of FIG. 1B relative to the gap 402, the solder resist pattern 13a coating thereon also forms a similar convex/concave shape. When the semiconductor apparatus 1 is mounted on a printed wiring substrate 500 described later, the convex/concave shape leads to alleviation of stress acting on the semiconductor apparatus 1. As illustrated in FIG. 1A, since the gap 402 forming a concave shape relatively to the conductors 401 has a radial shape from the center of the XY plane of the substrate 10, the above-described insulating paste 21 can be easily applied; fugitivity of voids is increased at the time of application; and therefore, closeness and adhesiveness are improved between the dummy pattern 40 and the IC chip 20. Consequently, the IC chip 20 can be easily and certainly mounted when the semiconductor apparatus 1 is manufactured.

In the implementation, after the IC chip 20 is mounted on the substrate 10 with the dummy pattern 40 formed, the upper side of the substrate 10 is sealed with mold resin (insulating resin) 50.

<<Circuit Apparatus>>

Figure 4A:
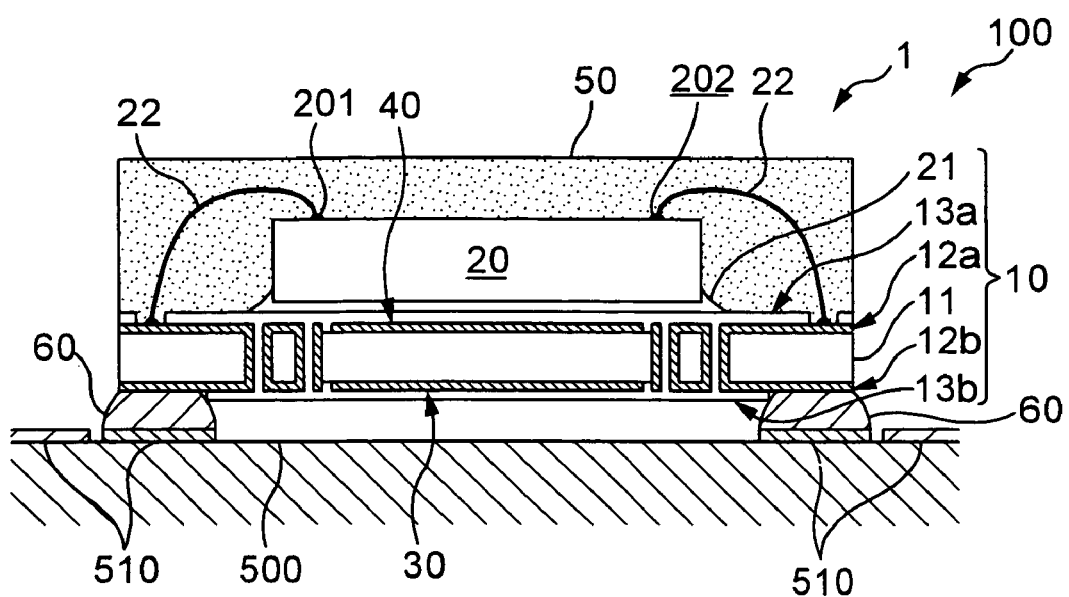
FIG. 4A is a side view of a circuit apparatus of the implementation.

As illustrated in a side view of FIG. 4A, the above-described semiconductor apparatus. 1 is mounted on the printed wiring substrate (second substrate) 500 along with other semiconductor apparatuses to constitute one (1) circuit apparatus 100 of a portable electronic device, for example. In the implementation, the external terminals (e.g., VCC, L1, L2) on the under side of the semiconductor apparatus 1 are electrically connected to a conductive path 510 on the printed wiring substrate 500 via solder bumps 60, for example. The solder bumps 60 also serve to support the semiconductor apparatus 1 on the printed wiring substrate 500.

In the implementation, a conductor such as the conductor path 510 does not exist on the surface of the printed wiring substrate 500 facing the coil 30 of the semiconductor apparatus 1. On the other hand, in the implementation, the dummy pattern 40 exists between the IC chip 20 and the coil 30. Since the inductive noise, etc. at the time of the operation of the IC chip 20 are blocked with this dummy pattern 40, the inductance characteristic of the coil 30 may be stabilized. Therefore, for a single semiconductor apparatus 1, if an error is generated in the mounting position, etc. of the IC chip 20 relative to the substrate 10 in the manufacturer of the semiconductor apparatus 1, the inductance characteristic and the stability thereof of the coil 30 are less affected by the operation of the IC chip 20. Since the conductor does not exist on the printed wiring substrate 500 near the coil 30, the mutual inductance coupling with the coil 30 may be formed mainly by the dummy pattern 40. Therefore, if the dummy pattern 40 is designed by the manufacture such that the coil 30 of the single semiconductor apparatus 1 has a predetermined inductance characteristic, the predetermined inductance characteristic of the coil 30 is maintained as long as the mounting is performed by the user of the semiconductor apparatus 1 on a region of the printed wiring substrate 500 where the conductor does not exist. The above-described stabilization of the inductance characteristic of the coil 30 means that the inductance of the coil 30 is maintained as a predetermined value or that the inductance of the coil 30 is maintained within a predetermined range, for example.

Figure 4B:
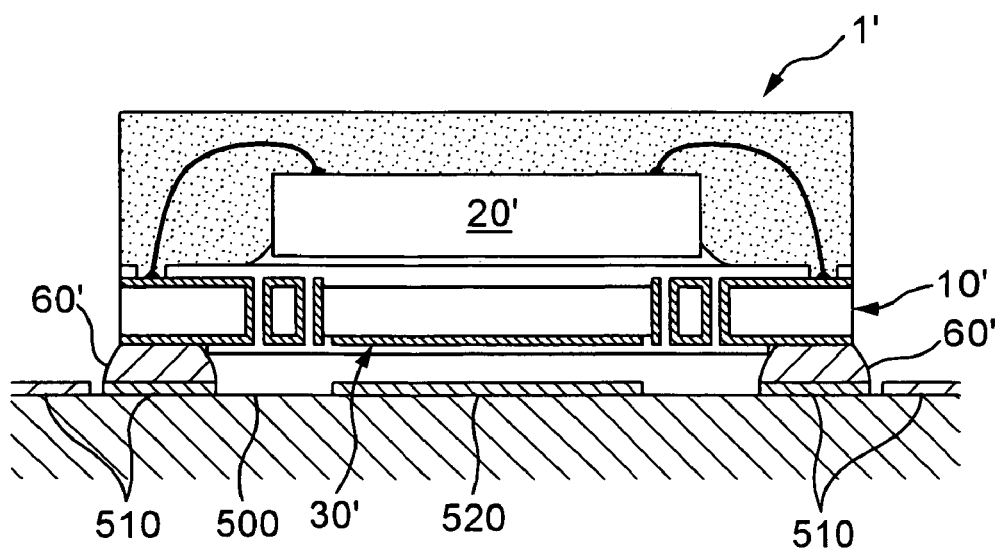
FIG. 4B is a side view of a conventional circuit apparatus.

On the other hand, as illustrated in a side view of FIG. 4B, a conventional semiconductor apparatus 1' does not have the dummy pattern 40 described above. Therefore, for example, a conductor 520 substituting the dummy pattern 40 must be preliminarily formed on the printed wiring substrate 500 on the user side. However, in the conductor 520, details of the shape, material, etc. must be depending on the design of the user side. The accuracy of the mounting position of the semiconductor apparatus 1' relative to the conductor 520 must be depending on the operating accuracy of the user side. Therefore, the mutual inductance, etc. between the conductor 520 and the coil 300 are varied depending on the design, the operating accuracy, etc. of the user side. Consequently, the inductance characteristic and the stability assumed on the manufacturer side based on the single semiconductor apparatus 1' may not be reproduced when mounting on an electronic device, etc. to be used on the user side. Alternatively, in order to reproduce the inductance characteristic and the stability, the user side may be forced to bear the burden in terms of the operation, etc. at the time of the mounting of the semiconductor apparatus 1'.

In consideration of the above, the semiconductor apparatus 1 of the implementation does not require the operating accuracy higher than the conventional operating accuracy at the time of manufacturing. Since the semiconductor apparatus 1 of the implementation is mounted on the region without a conductor, the operating accuracy higher than the conventional operating accuracy is not required at the time of mounting. Therefore, a low-cost semiconductor apparatus 1 is provided which can easily reproduce a pre-mounted inductance characteristic and stability thereof after mounting and which is easily mounted. If the inductance characteristic and the stability thereof of the coil 30 are maintained, a better frequency characteristic such as a Q value is obtained from the semiconductor apparatus 1 and better performance is obtained from the electronic device equipped with the semiconductor apparatus 1.

Although the above described circuit apparatus 100 (FIG. 4A) does not have a conductor at all on the printed wiring substrate 500 in the region surrounded by the under side of the semiconductor apparatus 1 and the solder bumps 60, the present invention is not limited to this. For example, a conductive path 530 (FIG. 5), a circuit element 300, etc. may exist in the region other than the surface facing the coil 30.

Figure 5:
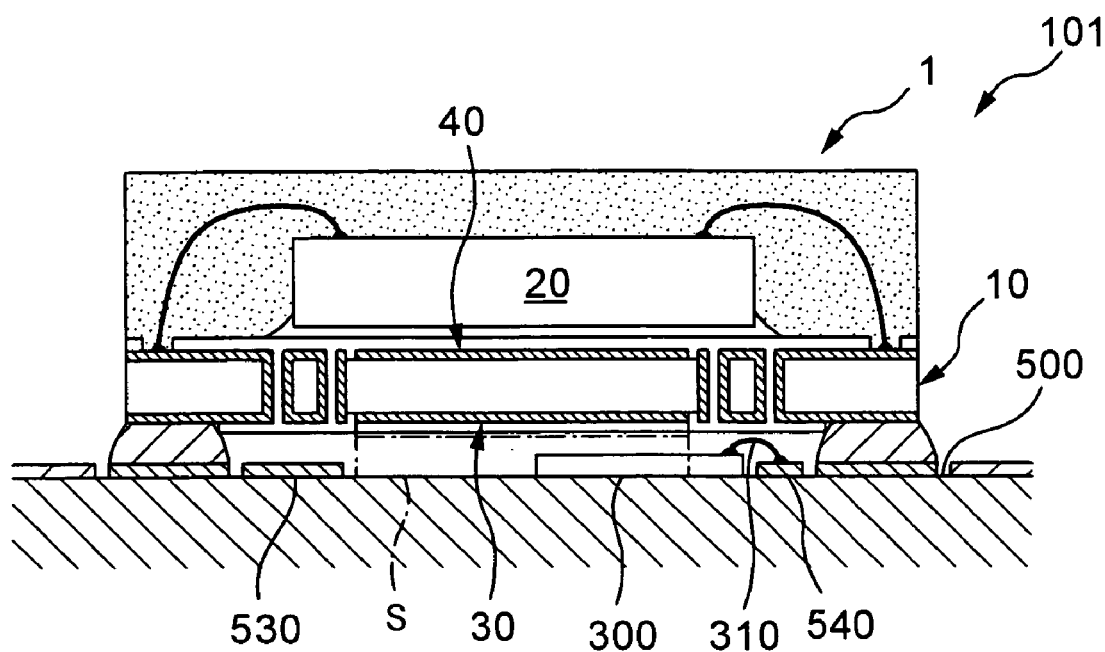
FIG. 5 is another side view of a circuit apparatus of the implementation.

In the circuit apparatus 101 illustrated in a side view of FIG. 5, for example, the conductive path 530 may exist under the semiconductor apparatus 1 as long as the conductive path 530 exists outside of a region S of the printed wiring substrate 500 facing the coil 30 on the under side of the semiconductor apparatus 1. Alternatively, for the circuit element 300 which has low degrees of the mutual inductance coupling with the coil 30, the inductive noise, etc., the circuit element 300 may exist under the semiconductor apparatus 1 as long as wire bonding to a conductive path 540 is performed with a metal thin line 310 in a region other than the region S.

The semiconductor apparatus 1 of the implementation has the substrate 10, the IC chip 20 fixed to the upper side of the substrate 10, and the coil 30 formed in a spiral shape on the underside of the substrate 10 as well as electrically connected to the IC chip 20, and is comprised of the dummy pattern 40 on a surface of the upper side of the substrate 10 facing the IC chip 20, in order to stabilize the inductance characteristic of the coil 30. Since the inductive noise, etc. at the time of the operation of the IC chip 20 are blocked with this dummy pattern 40, the inductance characteristic of the coil 30 may be stabilized. Since the inductive noise, etc. at the time of the operation of the IC chip 20 are blocked with this dummy pattern 40, the inductance characteristic of the coil 30 may be stabilized. Therefore, for a single semiconductor apparatus 1, if an error is generated in the mounting position, etc. of the IC chip 20 relative to the substrate 10 in the manufacturer of the semiconductor apparatus 1, the inductance characteristic and the stability thereof of the coil 30 are less affected by the operation of the IC chip 20. If the dummy pattern 40 is designed by the manufacture such that the coil 30 of the single semiconductor apparatus 1 has a predetermined inductance characteristic, the predetermined inductance characteristic of the coil 30 is maintained if the mounting is performed by the user of the semiconductor apparatus 1 on a region of the printed wiring substrate 500 where the conductor does not exist, for example. Therefore, a low-cost semiconductor apparatus 1 is provided which can easily reproduce a pre-mounted inductance characteristic and stability thereof after mounting and which is easily mounted.

In the semiconductor apparatus 1 described above, preferably, the IC chip 20 is fixed to the dummy pattern 40 via the insulating paste 21. In this way, since the IC chip 20 can be fixed in the vicinity of the dummy pattern 40, the inductive noise, etc. at the time of the operation of the IC chip 20 can be blocked more effectively.

In the semiconductor apparatus 1 described above, preferably, the dummy pattern 40 is constituted by arranging a plurality of the isolated conductors 401 in a predetermined shape spaced by the predetermined gaps 402. In this way, when the semiconductor apparatus 1 is mounted on, for example, the printed wiring substrate 500, this leads to alleviation of stress acting on the semiconductor apparatus 1.

In the semiconductor apparatus 1 described above, preferably, the dummy pattern 40 is constituted by arranging a plurality of the isolated conductors 401 in an approximate rectangular shape such that a plurality of the predetermined gaps 402 is arranged approximately linearly to be crossed. In this way, since the predetermined gaps 402 may form, for example, a concave shape relative to the conductor 401, the insulating paste 21 can be easily applied. Therefore, at the time of the manufacturing of the semiconductor apparatus 1, the IC chip 20 can be easily mounted and the accuracy of the mounting position of the IC chip 20 is improved in the semiconductor apparatus 1.

In the semiconductor apparatus 1 described above, preferably, the IC chip 20 is a rectangular and the plurality of the predetermined gaps 402 arranged approximately linearly to be crossed is provided to have a predetermined angle relative to the external edge of the IC chip 20. In this way, since the predetermined gaps 402 may have a radial shape from the center of the substrate 10, the fugitivity of voids is increased at the time of the application of the isolating paste 21.

The semiconductor apparatus 1 described above is constituted by having: the substrate 10; the IC chip 20 fixed to the upper side of the substrate 10; the coil 30 formed in a spiral shape on the under side of the substrate 10; the through-hole penetrating between the upper side and under side of the substrate 10 and electrically connecting the electrode (e.g., electrode 202) of the IC chip 20 with the electrodes 124b, 127b, 128b, 301b, 302b of the coil; the dummy pattern 40 formed on the surface facing the IC chip 20 on the upper side of the substrate for stabilizing the inductance characteristic of the coil 30; the through-hole penetrating between the upper side and under side of the substrate 10 and electrically connecting another electrode (e.g., electrode 201) of the IC chip 20 and the electrode (e.g., external terminal 123b) formed on the under side of the substrate 10; the solder bump 60 formed on the under side of the substrate for electrically connecting the coil 30 and the electrode formed on the under side to the printed wiring substrate 500 while the under side of the substrate 10 faces to the printed wiring substrate 500; and the mold resin 50 for sealing the upper side of the substrate 10. Such a semiconductor apparatus 1 can easily reproduce the pre-mounted inductance characteristic and stability thereof after mounting and is easily mounted, as compared to a conventional apparatus.

The circuit apparatus 100 of the implementation is constituted by comprising: the semiconductor apparatus having the substrate 10, the IC chip 20 fixed to the upper side of the substrate 10, the coil 30 formed in a spiral shape on the under side of the substrate 10 and electrically connected to the IC chip 20, and the dummy pattern 40 on the surface facing the IC chip 20 on the upper side of the substrate for stabilizing the inductance characteristic of the coil 30; and the printed wiring substrate 500 to which the semiconductor apparatus 1 is mounted with the under side of the substrate 10 facing the printed wiring substrate 500. Better performance can be obtained from the electronic device incorporating the circuit apparatus 100 equipped with such a semiconductor apparatus 1.

In the circuit apparatus 100 described above, preferably, the conductive path of the printed wiring substrate 500 does not exist on the surface facing the coil 30 formed on the under side of the substrate 10. Better performance can be obtained from the electronic device incorporating the circuit apparatus 100 equipped with such a semiconductor apparatus 1.

<<Case that Coil Exists on Upper Side of Substrate and that Conductive Pattern Exists on Under Side>>

In the semiconductor apparatus 1 of the implementation described above, although the conductive pattern (dummy pattern 40) is formed on the upper side which is the IC chip side of the substrate (substrate 10) and the coil (coil 30) is formed on the under side of the substrate 10, this relative positioning relationship between the conductive pattern and the coil on the upper and under sides of the substrate may be reversed.

Figure 6A:
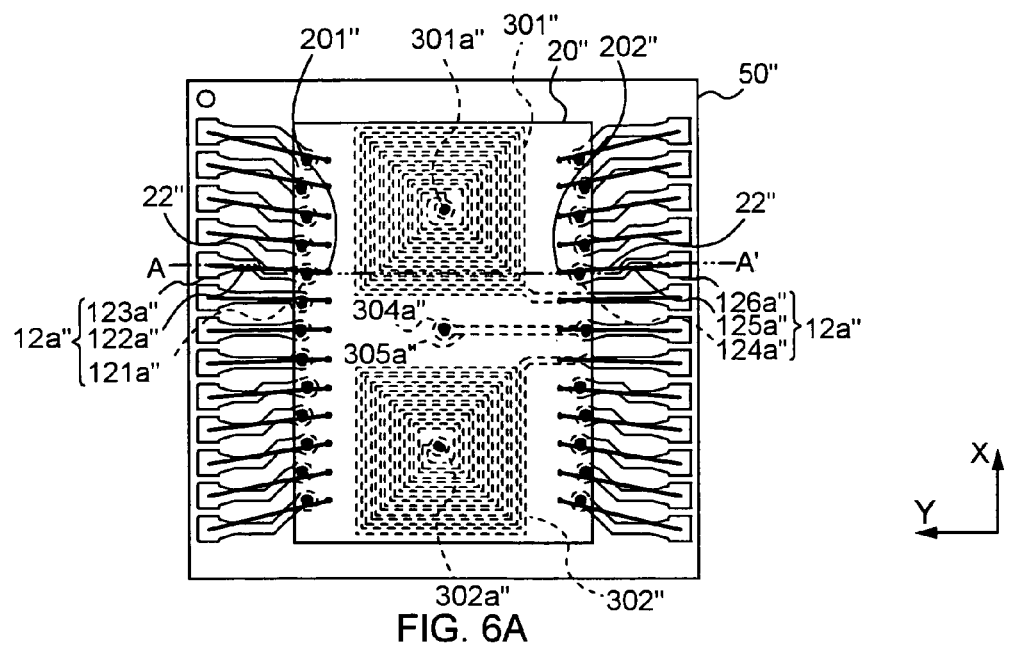
FIG. 6A is another plan view of the upper side of the semiconductor apparatus of the implementation.
Figure 6B:
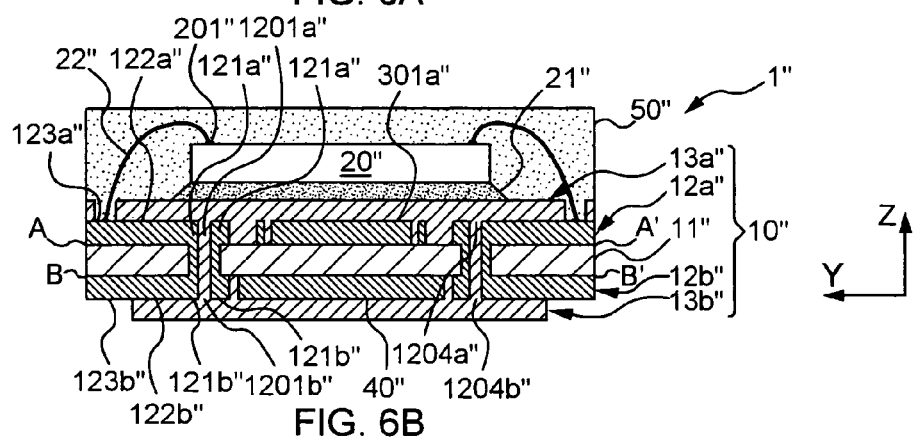
FIG. 6B is another side view of the semiconductor apparatus of the implementation.
Figure 6C:
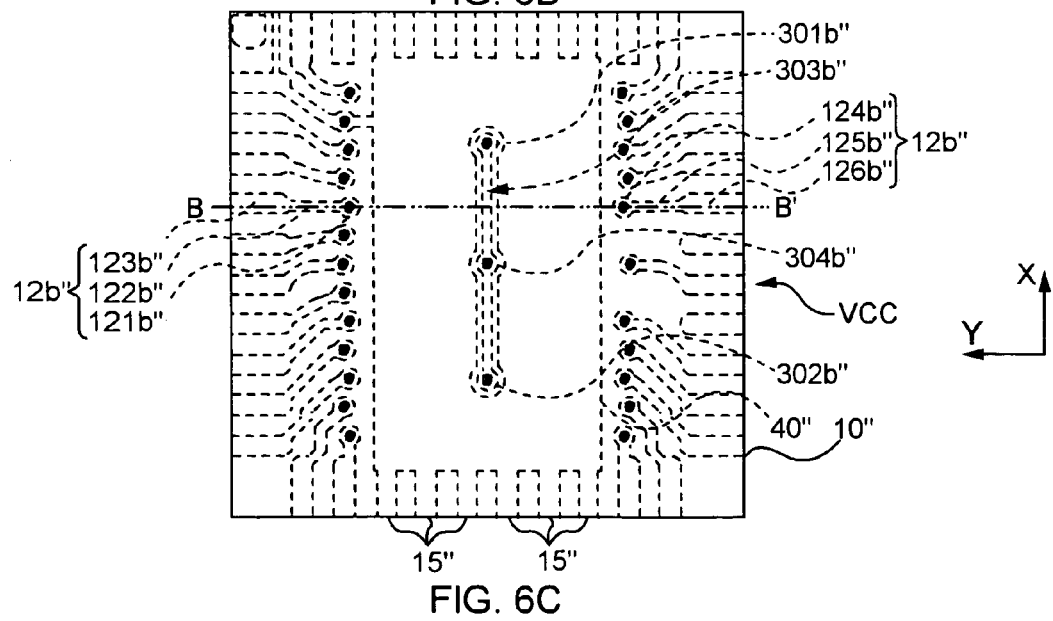
FIG. 6C is another perspective view of the under side of the semiconductor apparatus of the implementation seen from the upper side.

As shown in FIGS. 6A to 6C, in a semiconductor apparatus 1", a coil 30" is formed on the upper side of the substrate 10" and a dummy pattern 40" is formed on the under side of the substrate 10". FIG. 6A is a plan view of the upper side of the semiconductor apparatus 1"; FIG. 6B is a side view of the semiconductor apparatus 1"; and FIG. 6C is a perspective view of the under side of the semiconductor apparatus 1" seen from the upper side. Hereinafter, in this semiconductor apparatus 1", the IC chip side (+Z side) is referred to as the "upper side" and, in this semiconductor apparatus 1, the side opposite to the IC chip side is referred to as the "under side".

The semiconductor apparatus 1" in the implementation is a package having an appearance configuration approximately equivalent to the semiconductor apparatus 1 illustrated in FIGS. 1A to 1C except the relative positioning relationship described above. The semiconductor apparatus 1" is constituted by mainly comprising a substrate (first substrate) 10", an IC chip (semiconductor chip) 20", a coil 30", a dummy pattern (conductive pattern) 40.

As illustrated in FIG. 6B, with regard to the substrate 10", the main material is an insulating substrate 11" made of, for example, glass epoxy, and a predetermined conductive path 12a" is affixed to the upper side thereof, which is coated thereon with an insulating solder resist pattern 13a". To the under side of the insulating substrate 11", a predetermined conductive path 12b is affixed, which is coated thereon with an insulating solder resist pattern 13b". Through-holes are bored in the insulating substrate 11", penetrating between the upper side and under side.

As illustrated in FIG. 6A, the predetermined conductive path 12a" affixed to the upper side is constituted by comprising 26 IC chip patterns and through-hole opening electrodes 301a", 302a", 304a" for a bridge line path 303b" (FIG. 6C) described later. Each IC chip pattern is constituted by opening electrodes (e.g., opening electrodes 121a", 124a"), wiring (e.g., wiring 122a", 125a"), and internal electrodes (e.g., internal electrode 123a", 126a"). However, in the illustration of FIG. 6A, the IC chip pattern connected to an external terminal VCC (FIG. 6C) via the through-hole is also comprised of a line path 305a" extending along the Y axis to the opening electrode 304a". In the illustration of FIG. 6A, each IC chip pattern connected to coils 301", 302" does not have an opening electrode and is constituted by the wiring and the internal electrodes only.

As illustrated in FIG. 6C, the predetermined conductive path 12b" affixed to the under side is constituted by comprising patterns corresponding to the above-described 26 IC chip patterns and the bridge line path 303b". Each IC chip pattern is constituted by opening electrodes (e.g., opening electrodes 121b", 124b"), wiring (e.g., wiring 122b", 125b"), and external terminals (electrodes, e.g., external terminals 123b", 126b"). The above-described through-hole opening electrode 121a" on the upper side and the through-hole opening electrode 121b" on the under side are oppositely arranged on each side. The bridge line path 303b" is for the purpose of connecting two coils 301", 302". The bridge line path 303b" is connected to the external terminal VCC to have the same electric potential, via the through-hole connecting the opening electrode 304b" located at the center in the X axis direction and the opening electrode 304a" (FIG. 6A), the line path 305a" (FIG. 6A) and the through-hole in the IC chip pattern (FIG. 6A) described above. The bridge line path 303b" is electrically connected to the electrodes (e.g., electrodes 201", 202") of the IC chip 20", via the above-described IC chip pattern and a metal thin line 22" (FIG. 6A).

The IC chip 20" (FIGS. 6A and 6B) is a bear chip which is the same as the IC chip 20 illustrated in FIGS. 1A to 1C.

As illustrated in FIG. 6A, the coil 30" is composed of two flat coils 301", 302" in a spiral shape affixed to the insulating substrate 10", as a portion of the upper-side conductive path 12a" described above. As illustrated in FIG. 6B, the coils 301", 302" of the implementation are affixed to the upper side of the insulating substrate 10" and is coated with the solder resist pattern 13a". To this solder resist pattern 13a", the IC chip 20" is fixed via an insulating paste (insulating adhesive) 21". According to the illustration of FIG. 6A, two coils 301", 302" are in a same shape swirling in anticlockwise rotation from the center toward the outside on the surface of the substrate 10".

As illustrated in FIG. 6C, the dummy pattern 40" is formed on the under side of the insulating substrate 10" oppositely to the coils 301", 302" on the upper side of the insulating substrate 10". Specifically, the dummy pattern 40" of the implementation is constituted by a single conductor made mainly of, for example, copper (Cu) in an approximate rectangular shape surrounding the above-described bridge line path 303b" in the center portion thereof. In this way, since the conductor exists around the bridge line path 303b", the bridge line path 303b" acts as a so-called coplanar line path. Therefore, if an electromagnetic field is generated from the bridge line path 303b", the electromagnetic field is absorbed by the dummy pattern 40".

A contour of the dummy pattern 40" of the implementation is aligned to a contour of an approximate rectangular combining two coils 301", 302". In other words, this dummy pattern 40" has an outer edge at the same position as or a position beyond an outer rim of the case that two coils 301", 302" are considered as the integral coil 30". In this way, if an electromagnetic field is generated from the coil 30" to the underside (−Z side) when the coil 30" is operated, the electromagnetic field is absorbed by the dummy pattern 40".

The dummy pattern 40" is connected to a plurality of grounding terminals 15" described later to be the same electric potential.

As illustrated in FIG. 6C, the plurality of the grounding terminals 15" (electrodes) are affixed to the insulating substrate 10" for grounding when mounted on, for example, the printed wiring substrate 500 (FIG. 4A), along with the 26 external terminals described above, as a portion of the underside conductive path 12b" described above. However, the grounding terminals 15" are not limited for the purpose of grounding and may be any electrodes for maintaining the dummy pattern 40" to the same voltage. A voltage value of the same voltage is determined depending on a voltage in a predetermined site of the printed wiring substrate 500, for example. In this way, by maintaining the dummy pattern 40" in the mutual inductance coupling with the coil 30" to the same voltage to stabilize the electric potential thereof, the inductance characteristic of the coil 30" is more stabilized. The stabilization of the inductance characteristic of the coil 30" means that the inductance of the coil 30" is maintained as a predetermined value or that the inductance of the coil 30" is maintained within a predetermined range, for example.

In the implementation, the entire surface of the under side of the substrate 10" is coated with the solder resist pattern 13b" described above, except the plurality of the external terminals and the grounding terminals 15 described above.

In the implementation, after the IC chip 20" is mounted on the substrate 10" with the coil 30" formed, the upper side of the substrate 10" is sealed with mold resin (insulating resin) 50".

Within the semiconductor apparatus 1" of the implementation, the coil 30" is coupled with the dummy pattern 40 in the mutual inductance coupling. On the other hand, within the conventional semiconductor apparatus 1' (FIG. 4B), a conductive pattern does not exist. Therefore, an inductance value of the semiconductor apparatus 1" of the implementation is made smaller than an inductance value of the conventional semiconductor apparatus 1' by the mutual inductance coupling. Therefore, in the implementation, by changing the size and the number of wire turns of the coils 301", 302" as well as the proportion of line and space, etc. when forming the coils, the inductance value of the coil 30" is set greater than the conventional case such that the inductance value of the semiconductor apparatus 1" is equal to the inductance value of the conventional semiconductor apparatus 1'. In this way, since the inductance value of the semiconductor apparatus 1" is not shifted from a predetermined value set conventionally at the time of shipping from, for example, the manufacturer side, the semiconductor apparatus 1" is easy-to-use for the user side, for example.

According to the semiconductor apparatus 1" of the implementation, if the conductor does not exist on the printed wiring substrate 500 near the coil 30", the mutual inductance coupling with the coil 30" may be formed mainly by the dummy pattern 40". Therefore, if the dummy pattern 40" is designed in advance by, for example, the manufacture such that the coil 30 of the single semiconductor apparatus 1' has a predetermined inductance characteristic, the predetermined inductance characteristic of the coil 30" is maintained as long as the semiconductor apparatus 1" is mounted by, for example, the user on a region of the printed wiring substrate 500 where the conductor does not exist. Therefore, the semiconductor apparatus 1" is provided which can easily reproduce a pre-mounted inductance characteristic and stability thereof after mounting. If the inductance characteristic and the stability thereof of the coil 30" are maintained, a better frequency characteristic such as a Q value is obtained from the semiconductor apparatus 1" and better performance is obtained from the electronic device equipped with the semiconductor apparatus 1".

According to the semiconductor apparatus 1" of the implementation, if an electromagnetic field is generated from the coil 30", the bridge line path 303b", etc., the electromagnetic field is absorbed by the dummy pattern 40" and, therefore, the electromagnetic interference to the electronic device equipped with the semiconductor apparatus 1" can be constrained. Consequently, better performance is obtained from the electronic device.

As is the case with the semiconductor apparatus 1 illustrated in FIG. 1, the semiconductor apparatus 1" of the implementation may be a tuner apparatus such that a portion of the IC chip 20" and the coils 301", 302" are equivalent to an oscillator in a local oscillator circuit. An equivalent circuit of the semiconductor apparatus 1" of the implementation is the same as the equivalent circuit 2 illustrated in the circuit diagram of FIG. 2, except that the external terminals L1, L2 are not included. The semiconductor apparatus 1" of the implementation is not limited to such a tuner apparatus.

<<Two Line-Symmetry Coils>>

In the semiconductor apparatus 1" of the implementation described above (FIG. 6A), although two coils 301", 302" are formed in the same shape swirling in anticlockwise rotation from the center toward the outside on the surface of the substrate 10", the present invention is not limited to this.

Figure 7:
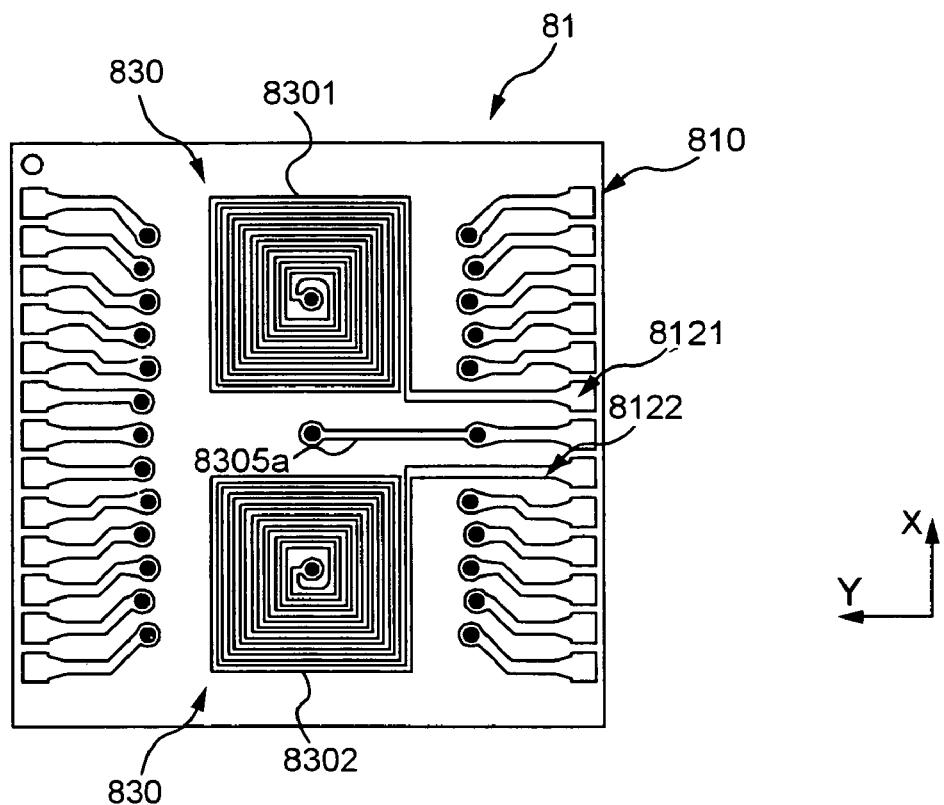
FIG. 7 is a plan view of the upper side of the substrate of the implementation.

For example, as shown in FIG. 7, two coils (first coil and second coil) 8301, 8302 of a semiconductor apparatus 81 may be formed to be line-symmetry shapes relative to a boundary along the Y axis direction. The figure is a plan view of the upper side of a substrate 810. In the illustration in the figure, the shapes of two coils 8301, 8302 are in a relationship of a mirror image to each other, relative to a boundary dividing a surface of the upper side of the substrate 810 facing the IC chip (e.g., IC chip 20" of FIG. 6A) in two, for example, a boundary passing through the middle point in the X axis direction and parallel to the Y axis. A line path 8305a corresponding to the above-described line path 305a" (FIG. 6a) is located on this boundary.

As described above, two coils 8301, 8302 are connected to the IC chip via two IC chip patterns 8121, 8122 and two metal thin lines (e.g., metal thin line 22" of FIG. 6B), respectively. Therefore, when two coils 8301, 8302 are line symmetry relative to the boundary described above, if two IC chip patterns 8121, 8122 and two metal thin lines are respectively formed to have the same configuration, inductance values of two coils 8301, 8302 including wiring can be made equal. In this way, since the package of the semiconductor apparatus 81 is easily designed and the configuration of the coil 830 including wiring is simplified, the manufacturing cost of the semiconductor apparatus 81 is reduced as a result.

<<Auxiliary Conductive Pattern>>

In the semiconductor apparatus 1" of the implementation described above (FIG. 6B), although the dummy pattern 40" is formed only on the under side of the substrate 10", the present invention is not limited to this. In the semiconductor apparatus 1" of the implementation described above, the IC chip 20" is provided via the solder resist pattern 13a" and the insulating paste 21" on the upper side of the insulating substrate 10" to which two coils 301", 302" are affixed. For example, an auxiliary conductive pattern having approximately the same shape as the dummy pattern 40" may exist between the solder resist pattern 13a" and the insulating paste 21".

Figure 8:
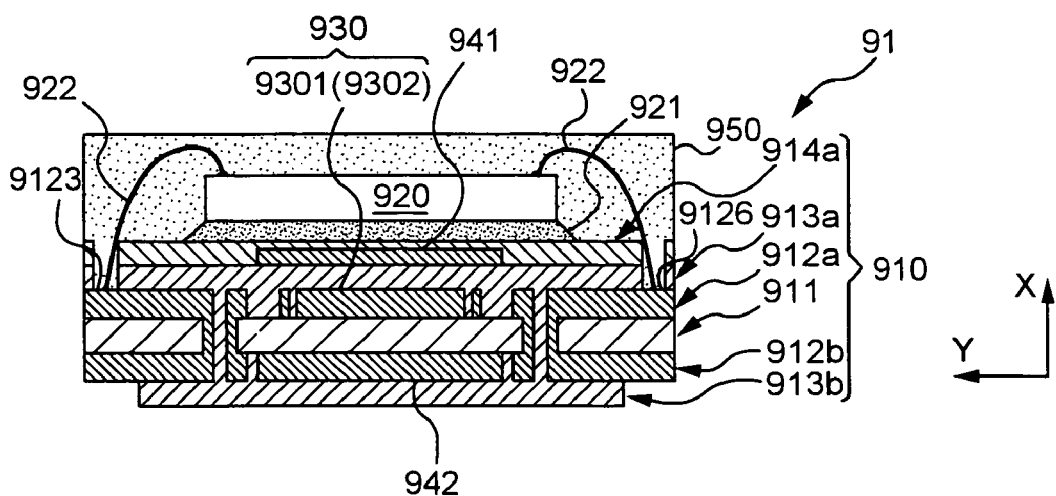
FIG. 8 is yet another plan view of the semiconductor apparatus of the implementation.

As illustrated in FIG. 8, for a substrate 910 of a semiconductor apparatus 91, the main material is an insulating substrate 911 made of, for example, glass epoxy, and to the upper side thereof: (1) a predetermined conductive path 912a (including coils 9301, 9302) is affixed; (2) an insulating solder resist pattern 913a coats thereon; (3) a dummy pattern (auxiliary conductive pattern) 941 is affixed thereon which has an approximate rectangular shape and which is constituted by a single conductor; and (4) an insulating solder resist pattern 914a coats thereon. To the under side of the insulating substrate 911: (5) a predetermined conductive pattern 912b and a dummy pattern (conductive pattern) 942 are affixed; and (6) an insulating solder resist pattern 913b coats thereon. FIG. 8 is a side view of the semiconductor apparatus 91.

In the semiconductor apparatus 91, in addition to the dummy pattern 942 provided on the under side of the substrate 910, another dummy pattern 941 exists between the IC chip 920 and the solder resist pattern (which can be considered as the insulating adhesive) 913a.

Since the inductive noise, etc. at the time of the operation of the IC chip 920 are blocked with this dummy pattern 941, the inductance characteristic of the coil 930 (coils 9301, 9302) may be stabilized. Therefore, for a single semiconductor apparatus 91, for example, on the manufacturer side, if an error is generated in the mounting position, etc. of the IC chip 920 relative to the substrate 910 of the semiconductor apparatus 91, the inductance characteristic and the stability thereof of the coil 930 are less affected by the operation of the IC chip 920. Since the mutual inductance coupling with the coil 930 may be formed mainly by two dummy patterns 941, 942, if two dummy patterns 941, 942 are designed in advance by, for example, the manufacture such that the coil 930 of the single semiconductor apparatus 91 has a predetermined inductance characteristic, the predetermined inductance characteristic of the coil 930 of the semiconductor apparatus 91 is easily maintained on the user side, for example.

<<FM Radio Receiver>>

Figure 9:
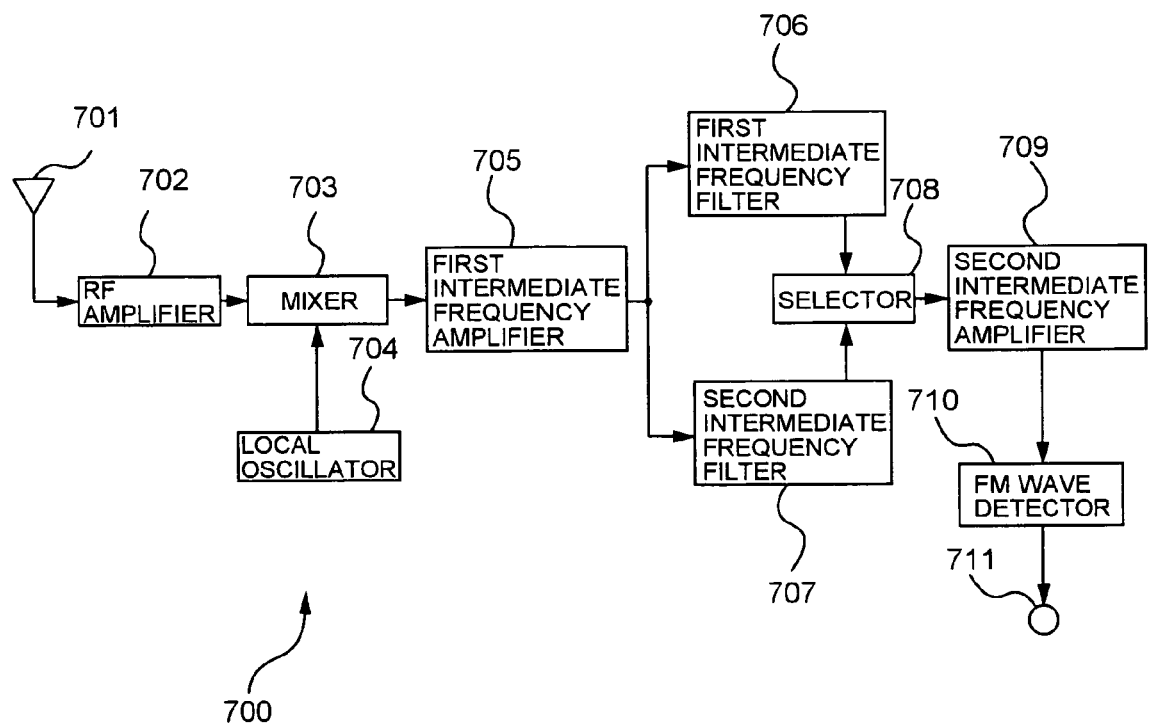
FIG. 9 is a block diagram showing a configuration example of an FM radio receiver of the implementation.

The semiconductor apparatuses 1, 1", 81, 91 described above are mounted as tuner apparatuses on the printed wiring substrate (second substrate) 500 (FIG. 4A) along with other semiconductor apparatuses to constitute a portable FM radio receiver (circuit apparatus) 700 (FIG. 9), for example. FIG. 9 is a block diagram showing a configuration example of the FM radio receiver 700.

As described in FIG. 9, the FM radio receiver 700 of the implementation is constituted by comprising an antenna 701, an RF amplifier 702, a mixer 703, a local oscillator 704, a first intermediate frequency amplifier 705, a first intermediate frequency filter 706, a second intermediate frequency filter 707, a selector 708, a second intermediate frequency amplifier 709, an FM wave detector 710 and an output terminal 711.

A broadcast station signal received by the antenna 701 is amplified by the RF amplifier 702 and mixed by the mixer 703 with a local oscillator signal from the local oscillator 704 to be converted to an intermediate frequency signal. The intermediate frequency signal is amplified by the first intermediate frequency amplifier 705 and is band-limited by the first intermediate frequency filter 706 or second intermediate frequency filter 707 and the selector 708. The band limited intermediate frequency signal is amplified or amplitude-limited by the second intermediate frequency amplifier 709 and is FM-modulated by the FM wave detector 710 to be output to the output terminal 711.

In the semiconductor apparatus 1, 1", 81, 91 as the tuner apparatus of the implementation, the external terminal (e.g., VCC) on the under side thereof is electrically connected via, for example, the solder bump 60 to the conductive path 510 of the printed wiring substrate 500 (FIG. 4A) to constitute the local oscillator 704. As described above, since a better frequency characteristic such as a Q value is obtained from the tuner apparatus, better performance is obtained from the FM radio receiver 700 of the implementation.

The circuit apparatus comprising the semiconductor apparatus 1, 1", 81, 91 of the implementation is not limited to the FM radio receiver 700. The circuit apparatus may be a portable receiver where the coil 30, 30", 830, 930 acts as an antenna for receiving, for example, radio signals, that is, a cellular phone, etc., for example.

Reproducibility of Inductance Characteristic and Stability Thereof Before and After Mounting The semiconductor apparatus 1" of the implementation is constituted by comprising the substrate 10, the IC chip 20" fixed to the upper side of the substrate 10", the spirally shaped coil 30" formed on the surface of the upper side of the substrate facing the IC chip 20" and electrically connected to the IC chip 20", and the dummy pattern 40" formed on the surface of the upper side of the substrate 10" facing the coil 30" for stabilizing the inductance characteristic of the coil 30". In the single semiconductor apparatus 1", the mutual inductance coupling with the coil 30" may be formed mainly by the dummy pattern 40". Therefore, if the dummy pattern 40" is designed in advance by, for example, the manufacture such that the coil 30 of the single semiconductor apparatus 1" has a predetermined inductance characteristic, the predetermined inductance characteristic of the coil 30" is maintained as long as the semiconductor apparatus 1" is mounted by, for example, the user away from the conductor, etc. Therefore, the pre-mounted inductance characteristic and stability thereof can be easily reproduced after the mounting. According to this semiconductor apparatus 1", if an electromagnetic field is generated from the coil 30", the electromagnetic field is absorbed by the dummy pattern 40" and, therefore, the electromagnetic interference can be constrained in the electronic device, etc. to which the semiconductor apparatus 1" is mounted.

In the semiconductor apparatus 1" described above, preferably, the IC chip 20" is fixed to the substrate 10" via the solder resist pattern 13a". In this way, since the IC chip 20" is electrically insulated from the conductive path 12a" which is a foundation of the solder resist pattern 13a", operations of the coil 30" and the IC chip 20" is stabilized.

In the semiconductor apparatus 1" described above, preferably, the semiconductor apparatus 1" is further comprised of the grounding terminals 15" formed on a surface of the under side of the substrate 10" for maintaining the dummy pattern 40" to the same voltage. By maintaining the electric potential of the dummy pattern 40" in the mutual inductance coupling with the coli 30" in this way, the inductance characteristic of the coil 30" is more stabilized. A voltage value of the same voltage is determined depending on a voltage in a predetermined site of the printed wiring substrate 500 (FIG. 4A), for example.

In the semiconductor apparatus 1" described above, preferably, a plurality of the grounding terminals 15" is grounded. For example, if the predetermined site described above is grounded, the mounting operation of the semiconductor apparatus 1" will be easier, for example, on the user side.

In the semiconductor apparatus 1" described above, preferably, the coil 30" has an inductance value greater than an inductance value of the case that the dummy pattern 40" is not provided. For example, by changing the size and the number of wire turns of the coil 30" as well as the proportion of line and space, etc. when forming the coil, the inductance value of the coil 30" is set greater than the conventional case such that the inductance value of the semiconductor apparatus 1" is equal to the inductance value of the conventional semiconductor apparatus 1' (FIG. 4B), for example. In this case, since the inductance value of the semiconductor apparatus 1" is not shifted from a predetermined value set conventionally at the time of shipping from, for example, the manufacturer side, the semiconductor apparatus 1" is easy-to-use for the user side, for example.

In the semiconductor apparatus 81 described above, the coil 830 may be composed of the coil 8301 and coil 8302 and the coil 8301 and coil 8302 may have line-symmetry shapes relative to a boundary dividing a surface of the upper side of the substrate 810 facing the IC chip (e.g., IC chip 20") in two. For example, two coils 8301, 8302 are connected to the IC chip (e.g., IC chip 20") via two IC chip patterns 8121, 8122 and two metal thin lines (e.g., metal thin line 22"), respectively. Therefore, when two coils 8301, 8302 are line symmetry relative to the boundary described above, if two IC chip patterns 8121, 8122 and two metal thin lines are respectively formed to have the same configuration, inductance values of two coils 8301, 8302 including wiring can be made equal. In this way, since the package of the semiconductor apparatus 81 is easily designed and the configuration of the coil 830 including wiring is simplified, the manufacturing cost of the semiconductor apparatus 81 is reduced as a result.

In the semiconductor apparatus 91 described above, the semiconductor apparatus 91 may be further comprised of the dummy pattern 941 existing between the IC chip 920 on the upper side of the substrate 910 and the solder resist pattern 913a for stabilizing an inductance characteristic of the coil 930. Since the inductive noise, etc. at the time of the operation of the IC chip 920 are blocked with this dummy pattern 941, the inductance characteristic of the coil 930 may be stabilized. Therefore, for a single semiconductor apparatus 91, for example, on the manufacturer side, if an error is generated in the mounting position, etc. of the IC chip 920 relative to the substrate 910 of the semiconductor apparatus 91, the inductance characteristic and the stability thereof of the coil 930 are less affected by the operation of the IC chip 920. Since the mutual inductance coupling with the coil 930 may be formed mainly by two dummy patterns 941, 942, if two dummy patterns 941, 942 are designed in advance by, for example, the manufacture such that the coil 930 of the single semiconductor apparatus 91 has a predetermined inductance characteristic, the predetermined inductance characteristic of the coil 930 of the semiconductor apparatus 91 is easily maintained on the user side, for example.

The semiconductor apparatus 1", 81, 91 of the implementation is constituted by comprising: the substrate 10", 810, 910; the IC chip 20", 920 fixed to the upper side of the substrate 10", 810, 910; a spirally shaped coil 30", 830, 930 formed on a surface of the upper side of the substrate 10", 810, 910 facing the IC chip 20", 920 and electrically connected to the IC chip 20", 920; the dummy pattern 40", 942 formed on a surface of the under side of the substrate 10", 810, 910 opposite to the coil 30", 830, 930 for stabilizing an inductance characteristic of the coil 30", 830, 930; the external terminal (e.g., external terminals 123b", 126b") formed on a surface of the under side of the substrate 10", 810, 910; the through-hole penetrating between the upper side and the under side of the substrate 10", 810, 910 and electrically connecting the electrode (e.g., electrodes 201", 202") of the IC chip 20", 920 and the external terminal (e.g., external terminals 123b", 126b") formed on a surface of the under side of the substrate 10", 810, 910; and the mold resin 50", 950 sealing the upper side of the substrate 10", 810, 910. In this way, the pre-mounted inductance characteristic and the stability thereof of the semiconductor apparatus 1", 81, 91 can be easily reproduced after the mounting and the electromagnetic interference can be constrained in the electronic device, etc. where the mounting is performed.

The FM radio receiver (circuit apparatus) 700 of the implementation is constituted by comprising: the tuner apparatus (semiconductor apparatus) 1", 81, 91 having the substrate 10", 810, 910, the IC chip 20", 920 fixed to the upper side of the substrate 10", 810, 910, a spirally shaped coil 30", 830, 930 formed on a surface of the upper side of the substrate 10", 810, 910 facing the IC chip 20", 920 and electrically connected to the IC chip 20", 920, and the dummy pattern 40", 942 formed on a surface of the under side of the substrate 10", 810, 910 opposite to the coil 30", 830, 930 for stabilizing an inductance characteristic of the coil 30", 830, 930; and the printed wiring substrate (e.g., printed wiring substrate 500) facing the under side of the substrate 10", 810, 910, to which the tuner apparatus (semiconductor apparatus) 1", 81, 91 is mounted. Since this tuner apparatus has a good frequency characteristic such as a Q value, the FM radio receiver 700 has better performance.

The above implementations of the present invention have been described for the purpose of facilitating the understanding of the present invention, rather than limiting the interpretation of the present invention. The present invention may be variously changed or altered without departing from the spirit thereof and encompasses equivalents thereof.

What is claimed is:

1. A semiconductor apparatus comprising:
   a substrate;
   a semiconductor chip fixedly secured on one side of the substrate;
   a spirally shaped coil formed on the other side of the substrate and electrically connected to the semiconductor chip; and
   a conductive pattern formed on a surface of the one side of the substrate facing to the semiconductor chip for stabilizing an inductance characteristic of the coil by mutual inductance coupling with the coil.

2. The semiconductor apparatus of claim 1, wherein the semiconductor chip is fixedly secured to the conductive pattern via an insulating adhesive.

3. The semiconductor apparatus of claim 1, wherein the conductive pattern includes a plurality of isolated conductive patterns in a predetermined shape spaced apart from one another by predetermined gaps.

4. The semiconductor apparatus of claim 3, wherein the conductive pattern includes a plurality of isolated conductive patterns in a substantially rectangular shape arranged such that the predetermined gaps extend substantially linearly and cross at angles with each other.

5. The semiconductor apparatus of claim 4, wherein the semiconductor chip is rectangular, and
   wherein the plurality of predetermined gaps crossing substantially linearly are disposed so as to define predetermined angles against an external edge of the semiconductor chip.

6. A semiconductor apparatus comprising:
   a first substrate;
   a semiconductor chip fixedly secured on one side of the first substrate;
   a coil formed in a spiral shape on the other side of the first substrate;
   a first through-hole extending between one side and the other side of the first substrate and electrically connecting an electrode of the semiconductor chip and an electrode of the coil;
   a conductive pattern formed on a surface of the one side of the first substrate facing to the semiconductor chip for stabilizing an inductance characteristic of the coil by mutual inductance coupling with the coil;
   a second through-hole extending between the one side and the other side of the first substrate and electrically connecting another electrode of the semiconductor chip and an electrode formed on the other side of the first substrate; and
   an insulating resin covering the one side of the first substrate.

7. A circuit apparatus comprising:
a semiconductor apparatus having a first substrate, a semiconductor chip fixedly secured on one side of the first substrate, a coil formed in a spiral shape on the other side of the first substrate and electrically connected to the semiconductor chip, and a conductive pattern formed on a surface of one side of the first substrate facing to the semiconductor chip for stabilizing an inductance characteristic of the coil by mutual inductance coupling with the coil; and
a second substrate mounted with the semiconductor apparatus such that the other side of the first substrate faces to the second substrate.

8. The circuit apparatus of claim 7, wherein the second substrate is free of conductive patterns facing to the coil formed on the other side of the first substrate.

9. A semiconductor apparatus comprising:
a substrate;
a semiconductor chip fixedly secured on one side of the substrate;
a spirally shaped coil formed on a surface of the one side of the substrate facing to the semiconductor chip and electrically connected to the semiconductor chip; and
a conductive pattern formed on a surface of the other side of the substrate opposite to the coil for stabilizing an inductance characteristic of the coil by mutual inductance coupling with the coil.

10. The semiconductor apparatus of claim 9, wherein the semiconductor chip is fixedly secured to the substrate via an insulating adhesive.

11. The semiconductor apparatus of claim 10, further comprising:
an auxiliary conductive pattern intervening between the semiconductor chip on the one side of the substrate and the insulating adhesive for stabilizing an inductance characteristic of the coil.

12. The semiconductor apparatus of claim 9, further comprising:
a plurality of electrodes for maintaining the conductive pattern formed on a surface of the other side of the substrate at a same potential.

13. The semiconductor apparatus of claim 12, wherein the plurality of electrodes are grounded.

14. The semiconductor apparatus of claim 9, wherein the coil has an inductance value greater than an inductance value of the case where the conductive pattern is absent.

15. The semiconductor apparatus of claim 9,
wherein the coil includes a first coil and a second coil, and
wherein the first coil and the second coil have line-symmetry shapes relative to a boundary dividing a surface of the one side of the substrate facing to the semiconductor chip in two.

16. A semiconductor apparatus comprising:
a first substrate;
a semiconductor chip fixedly secured to one side of the first substrate;
a spirally shaped coil formed on a surface of the one side of the first substrate facing to the semiconductor chip and electrically connected to the semiconductor chip;

a conductive pattern formed on a surface of the other side of the first substrate opposite to the coil for stabilizing an inductance characteristic of the coil by mutual inductance coupling with the coil;
an electrode formed on a surface of the other side of the first substrate;
a through-hole extending between the one side and the other side of the first substrate and electrically connecting an electrode of the semiconductor chip and an electrode formed on a surface of the other side of the first substrate; and
an insulating resin covering the one side of the first substrate.

17. A circuit apparatus comprising:
a semiconductor apparatus having a first substrate, a semiconductor chip fixedly secured to one side of the first substrate, a spirally shaped coil formed on a surface of the one side of the first substrate and electrically connected to the semiconductor chip, and a conductive pattern formed on a surface of the other side of the first substrate opposite to the coil for stabilizing an inductance characteristic of the coil by mutual inductance coupling with the coil; and
a second substrate facing to the other side of the first substrate and mounted with the semiconductor apparatus.

18. A semiconductor apparatus comprising:
a substrate;
a semiconductor chip fixedly secured on one side of the substrate;
a spirally shaped coil formed on the other side of the substrate and electrically connected to the semiconductor chip; and
a conductive pattern formed on a surface of the one side of the substrate facing to the semiconductor chip for stabilizing an inductance characteristic of the coil,
the conductive pattern including a plurality of isolated conductive patterns in a substantially rectangular shape spaced apart from one another by predetermined gaps such that the predetermined gaps extend substantially linearly and cross at angles with each other.

19. A semiconductor apparatus comprising:
a substrate;
a semiconductor chip fixedly secured on one side of the substrate;
a first spirally shaped coil and a second spirally shaped coil formed on a surface of the one side of the substrate facing to the semiconductor chip and electrically connected to the semiconductor chip; and
a conductive pattern formed on a surface of the other side of the substrate opposite to the coil for stabilizing an inductance characteristic of the first coil and the second coil,
the first coil and the second coil having line-symmetry shapes relative to a boundary dividing a surface of the one side of the substrate facing to the semiconductor chip in two.

* * * * *